United States Patent
Kesar et al.

(10) Patent No.: US 12,068,419 B2
(45) Date of Patent: Aug. 20, 2024

(54) HIGH-VOLTAGE FAST-AVALANCHE DIODE

(71) Applicant: Soreq Nuclear Research Center, Yavne (IL)

(72) Inventors: Amit Kesar, Yavne (IL); Gil Atar, Yavne (IL); Shoval Zoran, Yavne (IL); Doron Cohen-Elias, Yavne (IL)

(73) Assignee: Soreq Nuclear Research Center, Nahal Soreq (IL)

( * ) Notice: Subject to any disclaimer, the term of this patent is extended or adjusted under 35 U.S.C. 154(b) by 14 days.

(21) Appl. No.: 17/785,539

(22) PCT Filed: Oct. 21, 2020

(86) PCT No.: PCT/IB2020/059900
§ 371 (c)(1),
(2) Date: Jun. 15, 2022

(87) PCT Pub. No.: WO2021/123943
PCT Pub. Date: Jun. 24, 2021

(65) Prior Publication Data
US 2023/0040734 A1 Feb. 9, 2023

Related U.S. Application Data

(60) Provisional application No. 62/948,944, filed on Dec. 17, 2019.

(51) Int. Cl.
*H01L 29/864* (2006.01)
*H01L 29/66* (2006.01)

(52) U.S. Cl.
CPC ...... *H01L 29/864* (2013.01); *H01L 29/66113* (2013.01)

(58) Field of Classification Search
CPC ......... H01L 2924/12031; H01L 29/868; H01L 29/66159; H01L 29/864; H01L 29/66113; H01L 31/107; H01L 31/02027; H04N 25/773; G01T 1/248; G01J 2001/4466
See application file for complete search history.

(56) References Cited

U.S. PATENT DOCUMENTS

| | | | | |
|---|---|---|---|---|
| 4,127,932 A | * | 12/1978 | Hartman | H01L 31/107 257/458 |
| 4,660,008 A | | 4/1987 | Henry | |
| 2003/0006456 A1 | * | 1/2003 | Takahashi | H01L 29/749 257/E21.384 |

(Continued)

OTHER PUBLICATIONS

* R. J. Focia, E. Schamiloglu, C. B. Fleddermann, F. J. Agee and J. Gaudet, "Silicon diodes in avalanche pulse-sharpening applications," in IEEE Transactions on Plasma Science, vol. 25, No. 2, pp. 138-144, Apr. 1997 (Year: 1997).*

(Continued)

*Primary Examiner* — Eric A. Ward
*Assistant Examiner* — Nora Taylor Nix
(74) *Attorney, Agent, or Firm* — Dekel Patent Ltd.; David Klein

(57) ABSTRACT

A method of using a diode device including providing a diode that includes an active region including a 525 micron thick. 10 kΩ-cm, n-type, float zone wafer, and operating the diode as a silicon-avalanche semiconductor switch.

6 Claims, 1 Drawing Sheet

(56) References Cited

U.S. PATENT DOCUMENTS

2014/0339398 A1* 11/2014 Mazzillo ........... H01L 31/02327
                                                          250/208.2
2019/0109242 A1   4/2019 Ramu et al.
2020/0020681 A1*  1/2020 Boles ................. H01L 27/0629

OTHER PUBLICATIONS

Grekhov, I.V., Lyublinskiy, A.G. & Yusupova, S.A. High-power subnanosecond silicon avalanche shaper. Tech. Phys. 62, 812-815 (2017) (Year: 2017).*

PCT Search Report and Written Opinion PCT/IB2020/059900, Feb. 15, 2021.

Merensky et al., "The Driving Conditions for Obtaining Subnanosecond High-Voltage Pulses From a Silicon-Avalanche-Shaper Diode", IEEE Transactions on Plasma Science ( vol. 42, Issue: 12, Dec. 2014).

Grekhov et al., "High-power subnanosecond silicon avalanche shaper", Technical Physics vol. 62, pp. 812-815 (2017).

Rodin et al., "Dynamic avalanche breakdown of a p-n junction: Deterministic triggering of a plane streamer front", Appl. Phys. Lett. 86, 243504 (2005).

Kesar et al., "A fast avalanche Si diode with a 517 μm low-doped region", Appl. Phys. Lett. 117, 013501 (2020).

* cited by examiner

HIGH-VOLTAGE FAST-AVALANCHE DIODE

FIELD OF THE INVENTION

The present invention relates generally to high-voltage fast-avalanche diodes, such as a silicon-avalanche shaper or sharpener (SAS).

BACKGROUND OF THE INVENTION

The silicon-avalanche shaper or sharpener (SAS) is a fast closing semiconductor switch. For positive voltages, it operates in the negative, cathode to anode, direction. It receives a high-voltage pulse at its cathode, and, when turned on, the current through the device rises rapidly. Typical input voltages are in the order of a few kilovolts, with a rise-time of the order of nanosecond. The device turn on time is in the order of 100 ps. A similar operation is obtained with devices known as fast-ionization dynistors (FIDs), deep-layer dynistors (DLDs), delayed breakdown devices (DBDs), etc.

The current state-of-the-art knowledge shows that in order to get fast pulses, the device active region (e.g., the n in a $p^+$-n-$n^+$ structure) has to be thin, about 100 to 300 microns. Therefore in order to obtain a fast operation one has to use a thin active region. The tradeoff of a thin region is the lowering of the device voltage.

Fast high-voltage diodes such as the drift-step-recovery diode (DSRD) and the silicon-avalanche shaper (SAS) have been developed [references 1-4 and references therein].

Fast avalanche diodes can be used for various applications such as plasma discharge experiments [5] and for ultra-wideband pulse generation [6, 7]. The diode structure is typically p+-n-n+, where the n region is some 100 to 300 microns, $N_D=10^{14}$ cm$^{-3}$ [7-9]. For a given diode, the switching characteristics, such as rise-time, voltage, and residual voltage, depend mostly on the applied voltage and its rise-time [2, 7-11].

In [12], an impact ionization model shows that when a 8 kV/0.8 ns ramp is applied to a 100 micron $p^+$-n-$n^+$ structure, it results in a super-fast turn on from 8 kV to 10V in 15 ps, e.g 500 kV/ns.

In [13], a ramp of 180 kV/400 ps was applied to a stack of 44 series connected $p^+$-p-n-$n^+$ diodes, having a p-n junction depth of 180 microns. The load voltage was 150 kV with a 100-ps rise time.

In [14], a 2.5 kV/1 ns pulse was applied to a 100 micron $p^+$-n-$n^+$ structure, resulting in a 1 kV/100 ps voltage ramp applied to the load (e.g. 10 kV/ns). The experimental results were supported by a numerical simulation, showing electron concentration and the electric field along the structure at various times.

In all of the experimental papers, the input voltage per diode was between 2 and 4 kilo-volts in 0.4 to 1 ns, and the load voltage ramp was between 10 and 36 kV/ns. The active structure in these papers was less than 200 microns, thus deep diffusion of some tens of microns was required in order to achieve the desired active region.

SUMMARY

The present invention provides a high-voltage fast-avalanche diode, such as an SAS with a thick active region, above 300 microns, which can operate in the 100-ps range and obtain a higher voltage than the thin substrate. The condition for such operation is a high quality substrate with a high-resistivity, such as a float-zone wafer. Further advantages of the invention is that the manufacturing of such devices becomes substantially easier since it is easy to handle thick wafers without the risk of breaking, and there is no need for deep, 10-s of micron, diffusion in order to narrow the active region.

The invention provides a 7.9-kV, 100-ps rise-time silicon-avalanche shaper (SAS) diode. A high-voltage vertical p+-$n_0$-$n^+$ structure was designed using Synopsys-TCAD. The substrate is a 525-μm float-zone, N-type Si wafer, $N_D=10^{12}$ cm$^{-3}$. The p+-$n_0$ junction is fabricated using boron spin-on-dopant (SOD), whereas the $n_0$-$n^+$ junction is fabricated using phosphorus SOD on the other side of the wafer. An electrostatic voltage of 3 kV was demonstrated without breakdown. The results are supported by a numerical simulation.

DETAILED DESCRIPTION

Figure 1:
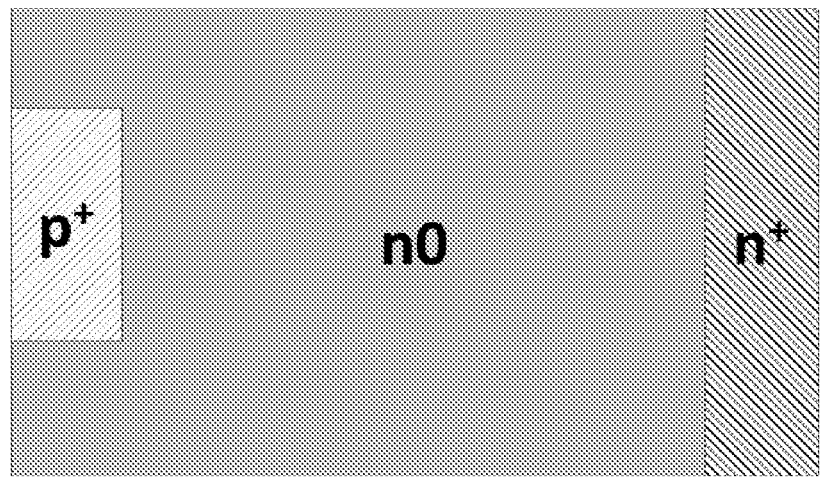
FIG. 1 illustrates SAS structure (not to scale), in accordance with an embodiment of the invention.
Figure 2:
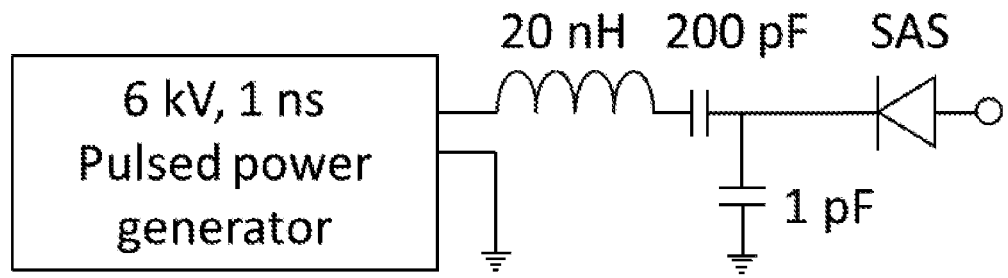
FIG. 2 illustrates an experimental setup circuitry for the device of the invention.

Reference is now made to FIGS. 1 and 2.

The SAS diode may be prepared by the following process, in accordance with a non-limiting embodiment of the invention:

First Implant, of the $p^+$ Layer:
1. A thermal oxide, $SiO_2$, is deposited on both sides of a 525 micron, 10 kΩ-cm, n-type, float zone wafer.
2. Selective opening in the "top" (boron) side is made via a mask which includes the $p^+$-$n_0$ junction, as in FIG. 1.
3. A boron-SOD is applied to the structure top side. It is noted that this step can be replaced by a standard method such as ion-implantation, or diffusion using a solid or a gas source. Also, other acceptor materials such as aluminum can be used as well.
4. A drive-in of the boron for a depth of a few microns is made.

Second Implant, of the n+ Layer:
1. Etching of the oxide in the "bottom" (phosphorous) side of the wafer is made.
2. A phosphorous SOD is applied to the structure bottom side. It is noted that this step can be replaced by a standard method such as ion-implantation, or diffusion using a solid or a gas source. Also, other donor materials such as arsenic can be used as well.
3. A drive-in of the phosphorous for a depth of about a few microns is made.

Finally, Metallic Contacts are Applied to the Structure.

A diode with a junction cross section of 4 mm² may be thus prepared. Its leakage current is measured at a reverse voltage of 3 kV. A 72 μA current is measured without a breakdown. When two diodes are connected in series the leakage current is reduced by a factor of 2.

In order to test it dynamically, the inventors connected its cathode to the ground via a 1 pF peaking capacitor, and also to a 6-kV, 1-ns pulsed-power generator (measured on a 50-Ω load) via a 200 pF DC-block capacitor and a 20 nH coil, as shown in FIG. 2. The SAS anode was connected to a 50Ω load and measured by a high-voltage attenuator and an 8-GHz oscilloscope. The inventors estimate that the maximum voltage obtained at the peaking capacitor before the SAS was turned on was about 14 kV.

Experimental Result

Figure 3:
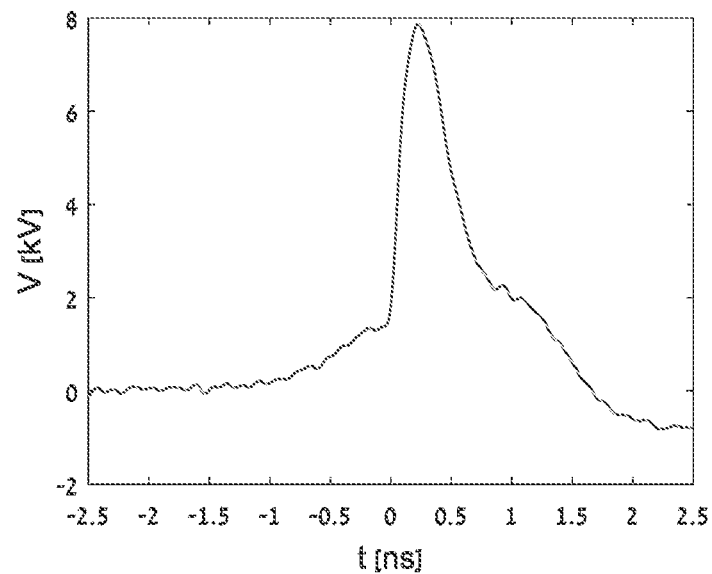
FIG. 3 shows the load voltage versus time, measured on a 50Ω load.

FIG. 3 shows the load voltage, measured on a 50Ω load. A peak voltage of 7.9 kV was obtained. Following a pre-pulse of about 1.5 kV, a sharp, 100-ps rise time was obtained. The maximum voltage rise-rate at the load was 52 kV/ns. The experimental results are supported by a numerical simulation (not shown here).

Comparison

Table 1 shows a comparison of this invention to two other state-of-the-art sharpening devices from the literature (first column). The second column shows the width of the active region. It is noted that the width in this invention is substantially wider, which enables working with a thick wafer, and alleviates the need for deep diffusion. Therefore it simplifies the process and reduces the cost.

The third and fourth columns describe the input and output pulse, respectively, in terms of peak voltage and rise-time. The fifth column describes the maximum rise-rate of the load voltage. The sixth column refers to the number of diodes used, in case of a high-voltage stack [13], thus, the seventh column calculates the rise-rate per diode. The eighth column shows a figure of merit for the sharpening quality, in terms of output rise-rate to input voltage and its rise-time.

It is seen that in this invention the voltage rise rate (single diode) and the quality of sharpening is higher than the prior art.

| Ref. | Active region | V-in | V-out | Max $dV_o/dt$ [kV/ns] | # of diodes, N | $(dV_o/dt)/N$ [kV/ns] | sharpening $(dV_o/dt)/$ (Vin/tr) |
|---|---|---|---|---|---|---|---|
| Lyubutin (2010) [13] | 180 μm | 180 kV/ 400 ps | 150 kV/100 ps | 1580 | 44 | 36 | 3.5 |
| Brylevskiy (2019) [14] | 100 μm | 2.2 kV/ 700 ps | 1.25 kV/100 ps | 10 | 1 | 10 | 3.2 |
| This invention | 520 μm | 10 kV/ 1 ns | 7.9 kV/100 ps | 48 | 1 | 52 | 5.2 |

REFERENCES

1. Kesar, A. S., et al. "6-kV, 130-ps rise-time pulsed-power circuit featuring cascaded compression by fast recovery and avalanche diodes." Electronics Letters 49.24 (2013): 1539-1540, and references therein.
2. Merensky, Lev M., et al. "The driving conditions for obtaining subnanosecond high-voltage pulses from a silicon-avalanche-shaper diode." IEEE Transactions on Plasma Science 42.12 (2014): 4015-4019, and references therein.
3. Kesar, Amit S., et al. "Characterization of a drift-step-recovery diode based on all epi-Si growth." IEEE Transactions on Plasma Science 44.10 (2016): 2424-2428, and references therein.
4. Kesar, Amit S. "A Compact, 10-kV, 2-ns risetime pulsed-power circuit based on off-the-shelf components." IEEE Transactions on Plasma Science 46.3 (2018): 594-597, and references therein.
5. Yatom, S., et al. "Spectroscopic study of plasma evolution in runaway nanosecond atmospheric-pressure He discharges." Physical Review E 88.1 (2013): 013107.
6. Kesar, Amit S. "Underground anomaly detection by electromagnetic shock waves." IEEE Transactions on Antennas : and Propagation 59.1 (2010) 149-153.
7. Kardo-Sysoev, A. F. "New power semiconductor devices for generation of nano and subnanosecond pulses," in Ultra-Wideband Radar Technology, J. D. Taylor, Ed. New' York: CRC Press, 2001.
8. Kardo-Sysoev, A. F., and M. V. Popova. "Modeling of fast ionization waves in silicon pn junctions under breakdown." Semiconductors 30.5 (1996): 431-435.
9. Grekhov, Igor V., et al. "High-power semiconductor-based nano and subnanosecond pulse generator with a low delay time." IEEE Transactions on Plasma Science 33.4 (2005): 1240-1244.
10. Minarskii, A. M., and Rodin, P. B. "Critical voltage growth rate when initiating the ultrafast impact ionization front in a diode structure." Semiconductors 34.6 (2000): 665-667.
11. Rodin, P., et al. "Superfast fronts of impact ionization in initially unbiased layered semiconductor structures." Journal of applied physics 92.4 (2002): 1971-1980.
12. Rodin, Pavel, et al. "Tunneling-assisted impact ionization fronts in semiconductors." Journal of applied physics 92.2 (2002): 958-964.
13. Lyubutin, Sergei K., et al. "High-power ultrafast current switching by a silicon sharpener operating at an electric field close to the threshold of the Zener breakdown." IEEE Transactions on Plasma Science 38.10 (2010): 2627-2632.
14. Brylevskiy, Victor, et al. "Picosecond-Range Avalanche Switching Initiated by a Steep High-Voltage Pulse: Si Bulk Samples Versus Layered pn Junction Structures." physica status solidi (b) 256.6 (2019): 1800520.

The invention claimed is:

1. A diode device comprising:
    a diode comprising a silicon-avalanche semiconductor switch that has an active region comprising a 525 micron thick, 10 kΩ-cm, n-type, float zone wafer, wherein a cathode of said diode is connected to ground via a 1 pF peaking capacitor, and also to a 6-kV, 1-ns pulsed-power generator via a 200 pF DC-block capacitor and a 20 nH coil.

2. The diode device according to claim 1, wherein said silicon-avalanche semiconductor switch has a rise time of 100 ps.

3. The diode device according to claim 1, wherein said silicon-avalanche semiconductor switch has an output voltage of 7.9 kV.

4. The diode device according to claim 1, wherein said silicon-avalanche semiconductor switch comprises a vertical p+-$n_0$-$n^+$ structure with a substrate comprising a float-zone, N-type Si wafer.

5. A method of using a diode device comprising:
    providing a diode comprising an active region comprising a 525 micron thick, 10 kΩ-cm, n-type, float zone wafer; and
    comprising operating said diode as a 7.9-kV, 100-ps rise-time silicon-avalanche semiconductor switch.

6. A method of using a diode device comprising:
    providing a diode comprising an active region comprising a 525 micron thick, 10 kΩ-cm, n-type, float zone wafer; and operating said diode as a silicon-avalanche semiconductor switch, wherein operating said diode comprises connecting a cathode of said diode to ground via a 1 pF peaking capacitor, and also to a 6-kV, 1-ns pulsed-power generator via a 200 pF DC-block capacitor and a 20 nH coil.

* * * * *